United States Patent
Richter et al.

(10) Patent No.: US 6,746,821 B2
(45) Date of Patent: Jun. 8, 2004

(54) METHOD OF STRUCTURING A PHOTORESIST LAYER

(75) Inventors: Ernst-Christian Richter, Erlangen (DE); Michael Sebald, Weisendorf (DE)

(73) Assignee: Infineon Technologies AG, Munich (DE)

(*) Notice: Subject to any disclaimer, the term of this patent is extended or adjusted under 35 U.S.C. 154(b) by 180 days.

(21) Appl. No.: 09/999,323

(22) Filed: Oct. 31, 2001

(65) Prior Publication Data
US 2002/0058425 A1 May 16, 2002

(30) Foreign Application Priority Data
Oct. 31, 2000 (DE) .......................................... 100 54 121
Apr. 27, 2001 (DE) .......................................... 101 20 659

(51) Int. Cl.$^7$ ................................................. G03C 5/56
(52) U.S. Cl. ..................... 430/311; 430/273.1; 430/330; 430/322; 430/270.1
(58) Field of Search .............................. 430/311, 273.1, 430/330, 322, 270.1

(56) References Cited

FOREIGN PATENT DOCUMENTS

EP      0 962 825 A1      12/1999

*Primary Examiner*—Mark F. Huff
*Assistant Examiner*—Daborah Chacko-Davis
(74) *Attorney, Agent, or Firm*—Laurence A. Greenberg; Werner H. Stemer; Ralph E. Locher

(57) ABSTRACT

A method structures a chemical amplification photoresist layer, in which a photoresist layer of the chemically amplified type is brought into contact, before or after the exposure for structuring, with a base which is capable of diffusing into the photoresist layer. As a result of this treatment with the base, greater steepness and less roughness of the resist profiles are achieved in the subsequent development step.

38 Claims, No Drawings

METHOD OF STRUCTURING A PHOTORESIST LAYER

BACKGROUND OF THE INVENTION

FIELD OF THE INVENTION

The invention relates to a method of structuring a photoresist layer.

Photolithographic methods for producing integrated circuits on a semiconductor substrate play a key role in semiconductor technology. A radiation-sensitive resist layer is applied to the surface of that layer of substrate that is to be structured. Then, the resist layer is exposed to light of suitable wavelengths in selected parts. Thereafter, only the exposed part of the photoresist layer is removed from the substrate by a suitable developer. The pattern thus produced in the photoresist layer corresponds to the pattern that is to be transferred in a further method step into the substrate layer that is located under the photoresist layer and is to be structured. Examples of further method steps include etching and ion implantation. In this subsequent method step, the developed photoresist layer thus serves as a mask that prevents a change of material, for example ablation of material, in those parts of the substrate layer that are covered by it. After the structuring method step, the photoresist mask is removed and thus does not become part of the integrated circuit.

Resists from the class including the chemical amplification resists (CAR) have proven particularly useful as photoresists. Chemical amplification resists are characterized in that they include a photosensitive acid generator, i.e. a photosensitive compound that generates a protic acid on exposure to light. This protic acid, optionally with thermal treatment of the resist, then initiates acid-catalyzed reactions in the base polymer of the resist. As a result of the presence of the photosensitive acid generator, the sensitivity of the photoresist is substantially increased compared with a conventional photoresist. An overview of this topic is given by H. Ito in Solid State Technology, July 1996, page 164 et seq.

The principle of chemical amplification has become widely used both in the case of one-layer resists developable under wet conditions and in the case of the two-layer resist systems that can be completely or partly developed under dry conditions. In the case of the positive resists, applying the principle of acid-catalyzed cleavage creates the different solubilities of the exposed and of the unexposed photoresists. In acid-catalyzed cleavage, a polar carboxyl group is formed from a nonpolar chemical group of the layer-forming polymer, for example a tert-butyl carboxylate group, in the presence of a photolytically produced acid, optionally in a heating step. Further examples of nonpolar "blocked" groups that can be converted into corresponding polar groups by acid-catalyzed reactions are the tert-butoxycarbonyloxy (tBOC) or acetal groups. Through the conversion of the nonpolar group into the corresponding polar group, the resist undergoes a change in polarity in the previously irradiated parts, with the result that it becomes soluble in the polar, aqueous alkaline developer. Consequently, the developer can selectively remove the exposed parts of the photoresist. The resist residues in the unexposed, nonpolar parts thus geometrically define a resist profile or a resist pattern on the substrate, which, in the following method steps, serves as a mask for surface structuring.

Owing to the constantly increasing integration density in semiconductor technology, the accuracy with which the resist profile can be produced after development on a surface to be structured is of decisive importance. On the one hand, the resist profile is physically uniquely predefined by the light distribution during exposure to light. On the other hand, it is chemically transferred to the resist layer by the distribution of the components photochemically produced by the exposure to light.

Owing to the physicochemical properties of the resist materials, completely unfalsified transfer of the pattern predetermined by the lithographic mask to the resist profile is however not uniquely possible. In particular, interference effects and light scattering in the photoresist play a major role here. However, the steps following the exposure, such as the development, also additionally have a great effect on the quality of the resist profiles. The quality of the resist profiles is substantially determined by the profile sidewalls. In order to achieve surface structuring that is as precise as possible in the subsequent method steps, it would be ideal if it were possible to obtain virtually perpendicular, smooth profile sidewalls in the resist profile after the development of the photoresist.

The light intensity profile occurring during the exposure in the photoresist has an adverse effect on the steepness of the profile sidewalls that is to be achieved. This characteristic intensity profile, which is also referred to as "areal image", is due to the light scattering and light absorption occurring in the resist during the exposure to light. Since the photoresist absorbs a certain proportion of the incident radiation, the observed radiation intensity decreases with increasing layer thickness in the photoresist. Consequently, those parts of the photoresist layer that are close to the surface are more strongly exposed to light. In the case of a positive resist, the parts close to the surface are thus more readily soluble than the parts far away from the surface. The different solubilities within an exposed part of the resist often lead, in the case of positive resists, to flattening and to poor definition of the profile sidewalls. The light intensity profile in the photoresist describes the distribution of a photochemically changed species, for example, in the case of a positive resist, the distribution of the photolytically produced acid in the photoresist.

The quality and the steepness of the resist profiles are of decisive importance for transferring the structure from the photomask to the layer that is present underneath and is to be structured. A known approach for improving the quality of resist profiles in positive resists is described in European Patent Application EP 0 962 825 A1. In which, an improved steepness of the resist sidewalls is achieved by adding to the photoresist two photochemically active additives that are activated by radiation in respective different wavelength ranges.

On the other hand, the photoresist contains a photosensitive acid generator that, as already described above, liberates an acid on exposure to light of a defined wavelength range. The liberated acid then catalyzes the reaction of the convertible nonpolar groups of the layer-forming polymer of the photoresist into carboxyl groups and thus causes the photoresist to be soluble in the polar developer.

On the other hand, the photoresist contains, as a second photochemical additive, a crosslinking reagent that results in a reduction in the solubility of the photoresist. This crosslinking reagent is likewise activated by radiation. The radiation used for this purpose differs from the radiation used for activating the photosensitive acid generator.

In a first structuring exposure step in this method, the photosensitive acid generator is activated in the parts determined by the mask layout. In a subsequent, second floodlight exposure step, the total photoresist layer is exposed without the use of a photomask and hence the crosslinking reagent is photochemically activated over the entire area of the photoresist layer. As a result of the consequently initiated chemical crosslinking of the photoresist, its solubility is reduced. Because those parts of the photoresist that are close to the surface are more strongly exposed to light, they are more highly crosslinked and hence more insoluble than the parts far away from the surface. Through this selective solubility modification in the photoresist, higher developer selectivity in the aqueous developer is achieved, with the result that steeper resist profile sidewalls are obtained.

However, this approach has a decisive disadvantage because the crosslinking reaction leads to the formation of a three-dimensional network polymer, in particular in those parts of the photoresist that are close to the surface. This network polymer has changed development behavior compared with the original, linear layer-forming polymer, which leads to "rough", i.e. inexactly defined, for example frayed profile sidewalls. This roughness complicates the subsequent method steps, such as the etching of the substrate. Moreover, this method requires the use of two different photochemically active compounds that must be tailored both to one another and to the base polymer.

SUMMARY OF THE INVENTION

It is accordingly an object of the invention to provide a method of structuring a photoresist layer that overcomes the hereinafore-mentioned disadvantages of the heretofore-known devices of this general type and that structures a photoresist layer that reduces or entirely avoids the disadvantages described above. In particular, it is the object of the present invention to provide a method by which high accuracy of transfer of the structure predetermined by the lithographic mask to a photoresist layer is achieved.

With the foregoing and other objects in view, there is provided, in accordance with the invention, a method of structuring a photoresist layer. The first step is providing a substrate. The next step is applying a photoresist layer at least partially to the substrate. The photoresist layer includes a film-forming polymer having molecular groups that is convertible into alkali-soluble groups at a temperature by acid-catalyzed cleavage reactions. The photoresist layer also includes a photosensitive acid generator for liberating an acid when exposed to light in a defined wavelength range. The next step is partially exposing the photoresist layer to light in the defined wavelength range. The next step is contacting the photoresist layer with a base over a specific period. The next step is allowing the base to diffuse into the photoresist layer. The next step is heating the photoresist layer to the temperature to cause the cleavage reaction catalyzed by the photolytically produced acid. The next step is developing the photoresist layer.

According to the invention, a method of structuring a photoresist layer is provided that includes the following steps. A substrate is provided on which a photoresist layer has been applied at least in parts. The photoresist layer includes a film-forming polymer that has molecular groups that can be converted into alkali-soluble groups by acid-catalyzed cleavage reactions. Furthermore, the polymer includes a photosensitive acid generator that liberates an acid on exposure to light from a defined wavelength range. The photoresist layer is exposed in parts to light from the defined wavelength range and is brought into contact, over a specific period, with a base that is soluble in the photoresist layer. It is not important whether the photoresist layer is brought into contact with the base after the irradiation or whether this is effected before the irradiation. The photoresist layer is then heated to a temperature at which the cleavage reaction catalyzed by the photolytically produced acid takes place. The photoresist layer is then developed.

Other features that are considered as characteristic for the invention are set forth in the appended claims.

Although the invention is illustrated and described herein as embodied in a method of structuring a photoresist layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In the context of this invention, the term "alkali-soluble groups" include all groups that increase the solubility of the film-forming polymer in alkaline solutions. This term therefore covers, in particular, polar, functional groups, such as, carboxyl, hydroxyl, and carboxamido groups, or groups which have these functional groups. Furthermore, this term is also to be understood as meaning those groups that not only contribute to increased alkali solubility of the polymer but also those that additionally increase the transparency of the polymer—and hence of the photoresist layer—to light having very short wavelengths. This can be achieved by partly or completely fluorinating these groups. A suitable group is, for example, the 1,1,1,3,3,3-hexafluoro-2-hydroxyisopropyl group, by which the transparency of the polymer is increased at a wavelength of 157 nm.

Molecular groups that can be converted into alkali-soluble groups by acid-catalyzed cleavage reactions are to be understood as meaning acid-labile groups that have only slight alkali solubility and eliminate a molecular fragment as a result of the catalytic action of acids, optionally with simultaneous thermal treatment, the alkali-soluble groups being liberated on or in the polymer. This term therefore covers acid-labile protective groups as regularly used for positive resists. All conventional acid-labile protective groups may be used, such as ester groups, ether groups, cyclic or acyclic acetal groups, cyclic or acyclic ketal groups, silyl ethers, or cyanohydrins. Examples of suitable protective groups are mentioned, for example, in U.S. Pat. Nos. 5,932,391 and 6,114,086 to Ushirogouchi, et al. and Kobayashi, et al, respectively. The term "cleavage reaction catalyzed by the photolytically produced acid" is also to be understood in this sense, i.e. the cleavage reaction takes place under the action of the photolytically liberated acid.

Particularly preferred molecular groups in the present invention are ether groups, such as tert-alkyl ethers, in particular, tert-butyl ethers, tetrahydrofuranyl ethers, and/or tetrahydropyranyl ethers. Carboxylic esters are also preferred. Examples of suitable carboxylic esters include tert-alkylcarboxylic esters or tert-alkyl carboxylates, in particular tert-butylcarboxylic esters or tert-butyl carboxylates, tetrahydrofuranylcarboxylic esters or tetrahydrofuranyl carboxylates, and/or tetrahydropyranylcarboxylic esters or tetrahydropyranyl carboxylates is also preferred.

The use of polymers including molecular groups according to formula II:

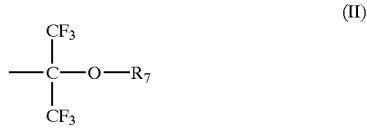

(II)

in which $R_7$ is selected from the group including tert-alkyl groups, in particular tert-butyl, tetrahydrofuranyl, tetrahydropyranyl, tert-butoxycarbonyloxy, or acetal groups, is also preferred.

In a further preferred embodiment of the method according to the invention, the molecular groups in the polymer that are capable of participating in the acid-catalyzed cleavage reactions are groups having the structure according to formula III, IV, or V

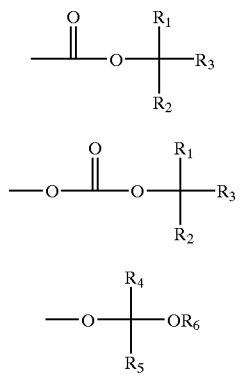

(III)

(IV)

(V)

in which $R_1$, $R_2$, and $R_3$, independently of one another, are selected from the group including methyl, ethyl, propyl and butyl and preferably $R_1$, $R_2$ and $R_3$ are methyl and $R_4$, $R_5$, and $R_6$, independently of one another, are selected from the group including hydrogen, methyl, ethyl, propyl and butyl, with the condition that only $R_4$ or $R_5$ may be hydrogen and $R_6$ is not hydrogen.

In addition to the acid-labile groups, further groups that improve the lithographic properties or the etch resistance of the photoresist may be present in the polymer. In a particularly preferred embodiment of the present invention, the polymer additionally has further reactive groups, such as, anhydride or succinic anhydride groups. These reactive groups permit a subsequent chemical treatment of the resist structures.

For the present invention, the nature of the main chain of the film-forming polymer is of minor importance. Thus, all polymer types regularly used in photoresists are suitable. For example, polymers having pure carbon main chains that can be obtained, for example, by polymerization of unsaturated monomers, such as styrenes, acrylates, or methacrylates, are suitable. Also suitable are polymers having heteroatoms in the main chains, such as, polysiloxanes, polyethers, or polyesters. The main chain may be composed partly or completely of fluorinated building blocks in order to improve the transparency of the polymer at low wavelengths.

In an advantageous embodiment of the invention, the photoresist layer is applied to a substrate by applying a solution including a solvent, the film-forming polymer and the photosensitive acid generator to the substrate and then at least partly evaporating the solvent. In a particularly preferred embodiment of the method according to the invention, the photoresist layer is applied to the substrate by spin coating. All conventional photoresist solvents or mixtures thereof which are capable of taking up the resist components in a clear, particle-free solution having a long shelf-life and of ensuring a good layer quality on coating of the substrate can be used as solvents. Possible solvents include 1-methoxy-2-propyl acetate, cyclopentanone, cyclohexanone, butyrolactone, ethyl acetate or mixtures of at least two of the abovementioned solvents are particularly preferred for the method according to the invention. 1-Methoxy-2-propyl acetate is a particularly preferred solvent.

The solvent is preferably evaporated at temperatures between 60 and 160° C. In this so-called "prebake" heating step, the solvent is preferably completely removed from the photoresist.

In advantageous variants of the present invention, solutions for applying the photoresist layer to the substrate include from 1 to 50% by weight, preferably from 3 to 20% by weight, of film-forming polymer; from 0.01 to 10% by weight, preferably from 0.1 to 1% by weight, of photosensitive acid generator; and from 50 to 99% by weight, preferably from 88 to 96% by weight, of solvent.

The solution may contain, as further components, other additives for improving the shelf life, service life, film formation, the resolution, or the radiation sensitivity. In addition, other product-or process-improving properties can usually be produced by changing the composition of the photoresist layers or their solutions.

It is decisive for the method according to the invention that the photoresist layer be brought into contact with a base for a specific period before the development and optionally before an additional heating step in which the photolytically produced acid initiates the cleavage reaction. Any method for bringing into contact the base into contact with the photoresist layer can be used. For example, the photoresist layer can be exposed to a base-containing gas. The gas may include only the base or can be used together with an inert carrier gas. For example, a noble gas (e.g. helium or argon) or nitrogen may be used as the carrier gas.

In a preferred embodiment in which the photoresist layer is exposed to a base-containing gas, the base is selected from the group including ammonia, methylamine, ethylamine, dimethylamine, and/or diethylamine. The use of the base-containing gas enables the method to be completed in a particularly simple manner because bringing the photoresist layer into contact with the base can be achieved by simply changing from an inert atmosphere to a base-containing atmosphere. This is particularly easy to effect in terms of apparatus.

In a preferred embodiment of the method according to the invention, the photoresist layer is wetted with a liquid including the base. The liquid may be the base itself or a solution of the base in one or more solvents. All those compounds which are capable of diffusing into the photoresist layer used in each case, i.e. which are soluble in said layer, and can neutralize the photolytically produced acid are suitable as a base for the embodiments of the invention in which a base-containing gas or a base-containing liquid is used. These are preferably those bases that are soluble in the resist solvent.

Furthermore, the use of liquid bases without additional solvents is particularly preferred. Preferred bases here are in particular primary, secondary or tertiary amines; in addition mono-, di-, tri- or polyamines can be used. The amines may carry substituted or unsubstituted aliphatic or cyclic alkyl groups or aralkyl groups, aryl groups or silyl groups as substituents. Substituted or unsubstituted cyclic or heterocyclic amines may also be used. The use of one or more bases selected from the group including hexylamine, tripentylamine, 1,5-diaminopentane, N-methyl-2-pyrrolidone and/or 1,1,1,3,3,3-hexamethyldisilazane is particularly preferred for the method according to the invention.

If the base is brought into contact in a liquid carrier with the photoresist layer, a salt having the general structure according to formula I

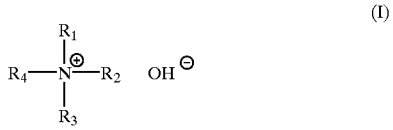

(I)

in which $R_1$, $R_2$, $R_3$ and $R_4$, independently of one another, are selected from the group including hydrogen, methyl, ethyl, propyl, and butyl, can then be used as the base in a further preferred variant of the method according to the invention. The use of tetramethylammonium hydroxide as the base is particularly preferred here. The ammonium bases are preferably used together with a sufficiently polar solvent, in particular water.

Typically (but not necessarily always), diffusion causes the base to become more concentrated in those parts of the photoresist layer that are closer to the surface. The photoresist layer thus has a base concentration gradient across its thickness: the concentration of the base decreasing with increasing layer depth. The period over which the photoresist layer is kept in contact with the base should be chosen so that the acid that is photolytically produced or is to be produced is neutralized at least partly, but not completely, by the base. Those exposed parts of the photoresist that are close to the surface must still have a residual solubility with respect to the developer. The diffusion rate of the base into the photoresist layer, the concentration of the photosensitive acid generator in the photoresist layer, the intensity of the irradiation, the quantum yield with which the decomposition of the photosensitive acid generator takes place and/or the diffusion rate of the liberated acid to the resist surface can be taken into account. These factors can be tailored to one another. The base thus counteracts the acid gradient caused by the absorptivity of the photoresist in the photoresist layer. In those parts of the photoresist layer that are close to the surface, the excess of acid is neutralized by the base.

The selective neutralization reaction improves the latent image in the still undeveloped photoresist layer for positive resists; i.e., the distribution of the photochemically produced acid becomes steep along the exposure edges. Consequently, after the development, on the one hand a substantial steepening of the resist profiles is achieved and, on the other hand, the "roughness" of the resist sidewalls, as observed in the case of the additional crosslinking of those parts of negative resists that are close to the surface after development, is avoided.

In a preferred embodiment of the method according to the invention, the photoresist layer is subjected, after the exposure and base treatment, to a heating step in which the photoresist layer is heated to a temperature at which the cleavage reaction catalyzed by the photolytically produced acid takes place. Preferably, the photoresist layer is heated to a temperature of from 80 to 250° C. In this heating step, the acid liberated can react with the acid-labile molecular Groups in the film-forming polymer and thus liberate the alkali-soluble groups on the polymer. As a result, the solubility of the polymer in alkaline solutions increases.

In order to activate the photosensitive acid generator, the photoresist layer is preferably exposed to light having a wavelength of from 150 to 300 nm in the method according to the invention. Using this DUV or VUV radiation (deep ultraviolet or vacuum ultraviolet), particularly fine structures can be produced in the photoresist layer. However, it is also possible to use light of longer wavelength, for example having a wavelength of from 300 to 450 nm, preferably from 350 to 450 nm (near-ultraviolet). In both cases, it is particularly preferred for the polymer to have an absorption adapted to the irradiation between 150 and 450 nm, so that the photosensitive acid generator can be photochemically activated.

In principle, all compounds that can liberate an acid on irradiation can be used as photosensitive acid generators. In proffered embodiments of the method, the following photosensitive acid generators can be used: onium compounds, in particular diphenyliodonium triflate and trisulfonium nonasulfate; nitrobenzyl esters, in particular 4-nitrobenzyl-9,10-dimethoxyanthracene 2-sulfonate; sulfones, in particular phenylacyl phenyl sulfone; phosphates, in particular triaryl phosphates; N-hydroximidosulfonates, in particular N-hydroxyphthalimidomethanesulfonate; and/or diazonaphthoquinones, in particular 1-oxo-2-diazonaphthoquinone 5-arylsulfonate. Further suitable photosensitive acid generators are disclosed in the German Patent Application having the application number 19820477.9.

Alkaline solutions are preferably used for developing the exposed photoresist layer. Water is preferably used as a solvent in these alkaline solutions. In a particularly preferred embodiment of the method according to the invention, the developer solution used is a solution of 2.38% by weight of tetramethylammonium hydroxide in water.

Hereafter, the following schematic example describes the method.

The photoresist layer of the chemically amplified type is applied by spin coating to the substrate to be structured and is dried in a subsequent heating step (between 60 and 160° C.), in which the solvent can evaporate. In the solid photoresist layer thus obtained, exposing the photoresist layer to light at a defined wavelength produces a latent image. The exposure for structuring is effected at a wavelength of 248 nm through a lithographic mask.

As a result of this exposure to light, the acid is liberated from the photosensitive acid generator. The undesired acid distribution within the resist layer is due to the absorption-related decrease in the light intensity within the photoresist layer, i.e. the concentration of the acid decreases continuously with increasing distance from the surface of the photoresist layer.

In order to counteract this, the photoresist layer is subsequently wetted with a basic liquid, whereby the base begins to diffuse into the photoresist layer. This produces, within the photoresist layer, a base gradient in which the concentration of the base increases toward the surface of the photoresist layer. As a result, the photolytically liberated acid is neutralized largely in those parts of the photoresist layer that are close to the surface than in the deeper-lying parts of this layer.

In the following heating step named the so-called "postexposure bake (PEB)", the temperature of which is above that of the first heating step (80 to 250° C.), on the one hand the functional protective groups in the film-forming polymer are cleaved by the acid produced during the exposure for structuring and, on the other hand, the acid is neutralized by the base. In addition, the heating step facilitates the diffusion of the base into the polymer layer. In the exposed parts, the resist is thus soluble in the alkaline developer. The photoresist layer is then treated, for example, with a 2.38% strength by weight aqueous tetramethylammonium hydroxide solution, with the result that the exposed parts of the photoresist layer are dissolved and removed. A positive relief pattern is thus produced in the photoresist layer, i.e. the exposed parts of the photoresist mask are removed while the unexposed parts remain behind and can serve as a protective mask in a subsequent structuring step.

We claim:

1. A method of structuring a photoresist layer, which comprises:

providing a substrate;

applying a photoresist layer at least partially to the substrate; the photoresist layer including a film-forming polymer having molecular groups convertible into alkali-soluble groups at a given temperature by acid-catalyzed cleavage reactions, and including a photosensitive acid generator for liberating an acid when exposed to light in a defined wavelength range;

partially exposing the photoresist layer to light in the defined wavelength range;

contacting the photoresist layer with a base over a specific period;

allowing the base to diffuse into the photoresist layer;

heating the photoresist layer to the given temperature to cause the cleavage reaction catalyzed by the photolytically produced acid; and developing the photoresist layer.

2. The method according to claim 1, wherein the contacting step comprises covering the photoresist layer with a liquid including the base in order to contact the photoresist layer with the base.

3. The method according to claim 1, wherein the contacting step comprises exposing the photoresist layer to a gas including the base in order to contact the photoresist layer with the base.

4. The method according to claim 3, which further comprises including in the gas an inert carrier gas selected from the group consisting of noble gases and nitrogen.

5. The method according to claim 4, which further comprises selecting the noble gases from the group consisting of helium and argon.

6. The method according to claim 1, which further comprises utilizing an amine as the base.

7. The method according to claim 6, which further comprises selecting the amine from the group consisting of ammonia, methylamine, ethylamine, dimethylamine, diethylamine, hexylamine, tripentylamine, 1,5-diaminopentane, N-methyl-2-pyrrolidone, and 1,1,1,3,3,3-hexamethyldisilazane.

8. The method according to claim 1, which further comprises using as the base a salt having the general structure according to formula I

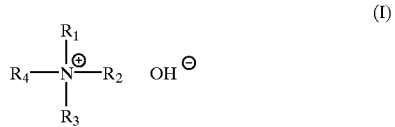

(I)

in which $R_1$, $R_2$, $R_3$, and $R_4$, independently of one another, are selected from the group consisting of hydrogen, methyl, ethyl, propyl, and butyl.

9. The method according to claim 1, which further comprises using tetramethylammonium hydroxide as the base.

10. The method according to claim 1, which comprises heating the photoresist layer to a temperature between 80 and 250° C.

11. The method according to claim 1, wherein the photosensitive acid generator liberates an acid when exposed to UV light having a wavelength of from 150 to 300 nm, and the partially exposing of the photoresist layer is to light having a wavelength of from 150 to 300 nm.

12. The method according to claim 1, wherein the photosensitive acid generator liberates an acid when exposed to UV light having a wavelength of from 300 to 450 nm, and the partially exposing of the photoresist layer is to light having a wavelength of from 300 to 450 nm.

13. The method according to claim 12, wherein the photosensitive acid generator liberates an acid when exposed to UV light having a wavelength of from 350 to 450 nm, and the partially exposing of the photoresist layer is to light having a wavelength of from 350 to 450 nm.

14. The method according to claim 1, which further comprises adapting the polymer to have an adapted absorption in the wavelength range of from 150 to 450 nm, so that the photosensitive acid generator can be photochemically activated.

15. The method according to claim 1, which further comprises selecting the photosensitive acid generator from the group consisting of onium compounds, nitrobenzyl esters, sulfones, phosphates, N-hydroximidosulfonates, and diazonaphthoquinones.

16. The method according to claim 15, which further comprises selecting the onium compounds from the group consisting of diphenyliodonium triflate and trisulfonium nonasulfate.

17. The method according to claim 15, which further comprises using 4-nitrobenzyl-9,10-dimethoxyanthracene 2-sulfonate as the nitrobenzyl ester.

18. The method according to claim 15, which further comprises using phenylacyl phenyl sulfone as the sulfone.

19. The method according to claim 15, which further comprises using triaryl phosphates as the phosphate.

20. The method according to claim 15, which further comprises using N-hydroxyphthalimidomethanesulfonate as the N-hydroximidosulfonate.

21. The method according to claim 15, which further comprises using 1-oxo-2-diazonaphthoquinone 5-arylsulfonate as the diazonaphthoquinone.

22. The method according to claim 1, which further comprises selecting molecular groups in the polymer capable of participating in the acid-catalyzed cleavage reactions from a group of carboxylic esters consisting of tert-alkyl carboxylates, tetrahydrofuranyl carboxylates, and tetrahydropyranyl carboxylates.

23. The method according to claim 1, which further comprises selecting the molecular groups in the polymer capable of participating in the acid-catalyzed cleavage reactions from a group of ethers consisting of tert-alkyl ethers, tetrahydrofuranyl ether, and tetrahydropyranyl ether.

24. The method according to claim 23, which further comprises using tert-butyl ether as the tert-alkyl ether.

25. The method according to claim 1, which further comprises selecting as the molecular groups in the polymer capable of participating in the acid-catalyzed cleavage reactions from the group consisting of cyclic ketals, acyclic ketals, cyclic acetals, and acyclic acetals.

26. The method according to claim 1, wherein the molecular groups in the polymer capable of participating in the acid-catalyzed cleavage reactions have a structure according to formula II

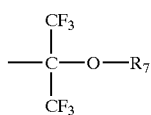
(II)

in which $R_7$ is selected from the group consisting of tert-alkyl groups, tetrahydrofuranyl, tetrahydropyranyl, tert-butoxycarbonyloxy, acetal groups, and groups having a structure according to formula III, IV, and V

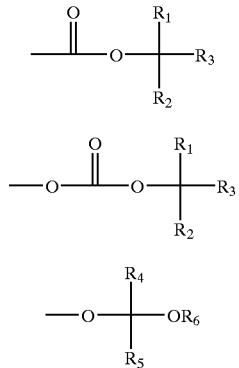
(III)
(IV)
(V)

$R_1$, $R_2$, and $R_3$, independently of one another, being selected from the group consisting of methyl, ethyl, propyl, and butyl; and $R_4$, $R_5$ and $R_6$, independently of one another, being selected from the group consisting of hydrogen, methyl, ethyl, propyl, and butyl, and only $R_4$ or $R_5$ may be hydrogen and $R_6$ is not hydrogen.

27. The method according to claim 26, wherein the tert-alkyl groups are tert-butyl.

28. The method according to claim 26, wherein $R_1$, $R_2$, and $R_3$ are methyl.

29. The method according to claim 1, which further comprises including anhydride structures in the film-forming polymer.

30. The method according to claim 1, which further comprises including succinic anhydride structures in the film-forming polymer.

31. The method according to claim 1, which further comprises:
  formulating the photoresist layer by preparing a solution including a solvent, the film-forming polymer, and the photosensitive acid generator;
  applying the solution to the substrate; and
  then at least partly evaporating the solvent.

32. The method according to claim 31, which further comprises selecting the solvent from the group consisting of 1-methoxy-2-propyl acetate, cyclopentanone, cyclohexanone, butyrolactone, ethyl acetate, and mixtures of at least two of the abovementioned solvents.

33. The method according to claim 31, which further comprises heating the solution to temperatures between 60 and 160° C. during the evaporating of the solvent.

34. The method according to claim 31, which further comprises:
  including from 1 to 50% by weight of film-forming polymer;
  including from 0.01 to 10% by weight of photosensitive acid generator; and
  including from 50 to 99% by weight of solvent.

35. The method according to claim 34, which further comprises including from 3 to 20% total by weight of film-forming polymer.

36. The method according to claim 34, which further comprises including from 0.1 to 1% total by weight of photosensitive acid generator.

37. The method according to claim 34, which further comprises including from 88 to 96% total by weight of solvent.

38. The method according to claim 1, which further comprises using a solution of 2.38% by weight of tetramethylammonium hydroxide in water for developing the photoresist layer.

* * * * *